(12) United States Patent
Chin

(10) Patent No.: US 7,061,417 B2
(45) Date of Patent: Jun. 13, 2006

(54) METHOD AND SYSTEM FOR INCREASED EFFECTIVE RESOLUTION IN AN N-BIT DIGITAL-TO-ANALOG CONVERTER

(75) Inventor: Douglas Chin, Haverhill, MA (US)

(73) Assignee: Broadcom Advanced Compression Group LLC, Andover, MA (US)

( * ) Notice: Subject to any disclaimer, the term of this patent is extended or adjusted under 35 U.S.C. 154(b) by 0 days.

(21) Appl. No.: 10/997,105

(22) Filed: Nov. 24, 2004

(65) Prior Publication Data

US 2005/0110668 A1  May 26, 2005

Related U.S. Application Data

(60) Provisional application No. 60/525,317, filed on Nov. 26, 2003.

(51) Int. Cl.
  H03M 1/66    (2006.01)
  H03M 5/08    (2006.01)
  H03K 3/017   (2006.01)
  H03K 5/04    (2006.01)
  H03K 7/08    (2006.01)

(52) U.S. Cl. .................. 341/144; 341/53; 327/175
(58) Field of Classification Search ........ 341/144, 341/53, 119, 139, 143, 152; 327/175, 530; 369/47.38; 375/358, 238
See application file for complete search history.

(56) References Cited

U.S. PATENT DOCUMENTS

| | | | | |
|---|---|---|---|---|
| 5,130,565 A | * | 7/1992 | Girmay | 327/175 |
| 5,379,321 A | * | 1/1995 | Girmay | 375/358 |
| 5,402,082 A | * | 3/1995 | Eccleston et al. | 327/530 |
| 5,764,165 A | * | 6/1998 | Buch | 341/53 |
| 5,815,102 A | * | 9/1998 | Melanson | 341/143 |
| 6,052,076 A | * | 4/2000 | Patton et al. | 341/144 |
| 6,191,722 B1 | * | 2/2001 | Briefer | 341/152 |
| 6,373,417 B1 | * | 4/2002 | Melanson | 341/143 |
| 6,462,690 B1 | * | 10/2002 | Gaboriau et al. | 341/144 |
| 6,522,273 B1 | * | 2/2003 | Fei et al. | 341/139 |
| 6,552,979 B1 | * | 4/2003 | Mokry et al. | 369/47.38 |
| 6,593,864 B1 | * | 7/2003 | Reilly | 341/119 |
| 6,927,715 B1 | * | 8/2005 | Chang et al. | 341/143 |
| 6,950,050 B1 | * | 9/2005 | Jordan | 341/144 |

* cited by examiner

*Primary Examiner*—Patrick Wamsley
(74) *Attorney, Agent, or Firm*—McAndrews, Held & Malloy, Ltd.

(57) ABSTRACT

In digital-to-analog conversion systems, a method and system for increased effective resolution in an N-bit DAC are provided. Additional resolution may be provided in an N-bit DAC by increasing the number of periods that an N-bit PWM may utilize to generate an output train of pulse widths with a desired duty cycle. An increased resolution bits parameter may correspond to the additional bits necessary to provide the increased resolution. An iterative process by which a desired value is converted into a sequence of N-bit control words may be based on a desired analog value and the increased resolution bits parameter. In addition to higher resolution, most of the output pulse AC energy is concentrated at the N-bit PWM basic frequency and above, allowing for simpler analog filtering of the pulse width modulated signal.

20 Claims, 4 Drawing Sheets

US 7,061,417 B2

METHOD AND SYSTEM FOR INCREASED EFFECTIVE RESOLUTION IN AN N-BIT DIGITAL-TO-ANALOG CONVERTER

CROSS-REFERENCE TO RELATED APPLICATIONS/INCORPORATION BY REFERENCE

This patent application makes reference to, claims priority to and claims benefit from U.S. Provisional Patent Application Ser. No. 60/525,317 filed on Nov. 26, 2003.

The above stated application is hereby incorporated by reference in its entirety.

FEDERALLY SPONSORED RESEARCH OR DEVELOPMENT

Not applicable.

MICROFICHE/COPYRIGHT REFERENCE

Not applicable.

FIELD OF THE INVENTION

Certain embodiments of the invention relate to the conversion of digital signals to analog signals. More specifically, certain embodiments of the invention relate to a method and system for increased effective resolution in an N-bit digital-to-analog converter.

BACKGROUND OF THE INVENTION

In electronic processing systems there are many instances in which it may be necessary or desirable to derive, from a digital number, an analog voltage that is proportional to the digital number. For example, in the operation of Voltage Controlled Oscillators (VCO), an analog voltage value that controls the frequency of oscillation of the VCO may be derived from a frequency control digital signal. Such derivation is called digital-to-analog conversion and the electronic device or circuit that implements this function is called a Digital-to-Analog Converter (DAC). In a traditional current steering implementation of a DAC, analog circuitry may be utilized in which each bit of the digital value controls an appropriately sized current source. For example, for an N-bit DAC there may be N current sources each coupled to one of the bits in the N-bit number and proportionally sized to the binary weight of the corresponding bit. The N current sources may then be coupled to a common resistor, where the voltage across the common resistor is proportional to the value of the N-bit digital number. When a zero (0) value is to be represented, the N current sources may be turned off and no voltage develops across the common resistor. The large area required for an analog-based DAC may be excessively costly for integrated circuits (IC) where most of its components are digital.

When the rate of change of the converted analog signal is low relative to the frequency of operation of the digital circuitry, a DAC may be implemented utilizing mostly digital circuitry. In such a case, the conversion may be accomplished by a first digital stage that generates a digital waveform that has an average duty cycle proportional to the digital value to be converted. This first digital stage is a pulse width modulation operation and a device that implements this operation is called a Pulse Width Modulator (PWM). Duty cycle refers to the fraction of time that the digital waveform is high during a specified period of time or cycle time. A second analog stage in the conversion may require passing the generated digital waveform through a low pass analog filter, resulting in an accurate approximation of the correct analog value from the duty cycle of the digital waveform. In this approach, only the analog filter stage of the DAC may require the implementation of analog components in or external to an IC.

In some instances, while the accuracy of a PWM-based DAC may be sufficient for an application, the resolution provided may be limited by the resolution available in the PWM. Moreover, the spectral properties of a PWM-based DAC may be such that the filtering operation performed by the second analog stage is difficult and costly to implement since a large portion of the AC energy of the digital waveform is concentrated at the PWM output frequency.

In other DAC implementations, for example, a Sigma-Delta ($\Sigma$-$\Delta$) DAC, the first digital stage may utilize oversampling and digital filtering to generate a more complex digital waveform which may have desirable spectral properties. This approach may reduce the cost of the second analog stage to filter out the unwanted high frequency components without affecting the desired analog signal. However, the first digital stage in $\Sigma$-$\Delta$ DACs may be very complex and therefore costly to implement in digital ICs.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for increased effective resolution in an N-bit digital-to-analog converter (DAC). Aspects of the method may comprise generating a plurality of control words based on a number of increased resolution bits and a digital representation of a desired analog value. The number of increased resolution bits may be determined based on the desired analog value and an N number of bits of resolution provided by an N-bit DAC. A plurality of pulse width modulated signals may be generated, wherein a duty cycle of each of the plurality of pulse width modulated signals corresponds to one of the generated control words. The amplitude of the generated desired analog value may be modified.

The method may also comprise an iterative process for generating the control words. The iterative process may comprise a plurality of rounds of processing, where in each round of processing a current accumulator value may be generated by adding the digital representation of the desired analog value to a previous accumulator value. The round of processing in the iterative process may also comprise generating a duty cycle by shifting down the generated current accumulator value by the number of increased resolution bits. Also in a round of processing in the iterative process, the generated duty cycle may be shifted up by the number of increased resolution bits. Moreover, during a round of processing in the iterative process, subtracting the shifted-up generated duty cycle to the generated current accumulator value may generate a next accumulator value. The duty cycle generated during a current round of processing in the iterative process may be assigned to one of the control words that correspond to the current round of processing. A zero value may be assigned to the previous accumulator value before a first round of processing in the iterative process.

The iterative process may be performed until a new desired analog value is provided or until an interrupt signal is provided.

Another embodiment of the invention may provide a machine-readable storage having stored thereon, a computer program having at least one code for increasing the effective resolution in an N-bit DAC, at least one code section being executable by a machine for causing the machine to perform the method described herein.

Aspects of the system may comprise a DAC controller that generates a plurality of control words based on a number of increased resolution bits and a digital representation of a desired analog value. The DAC controller may determine the number of increased resolution bits based on the desired analog value and an N number of bits of resolution provided by an N-bit DAC. The N-bit DAC may comprise an N-bit pulse width modulator (PWM) and an analog filter. The N-bit DAC may generate a plurality of pulse width modulated signals, wherein a duty cycle of each of the plurality of pulse width modulated signals corresponds to one of the generated control words.

The DAC controller may generate the control words by an iterative process. The iterative process may comprise a plurality of rounds of processing, where in each round of processing in the DAC controller a current accumulator value may be generated by adding the digital representation of the desired analog value to a previous accumulator value. The round of processing in the iterative process may also comprise generating a duty cycle by shifting down the generated current accumulator value by the number of increased resolution bits. Also in a round of processing in the iterative process, the generated duty cycle may be shifted up by the number of increased resolution bits. Moreover, during a round of processing in the iterative process, subtracting the shifted-up generated duty cycle to the generated current accumulator value may generate a next accumulator value. The DAC controller may assign a duty cycle generated during a current round of processing in the iterative process to one of the control words that correspond to the current round of processing. The DAC controller may also assign a zero value to the previous accumulator value before a first round of processing in the iterative process. The DAC controller may perform the iterative process until a new desired analog value is provided or until an interrupt signal is provided.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for increased effective resolution in an N-bit digital-to-analog converter (DAC). Additional effective resolution may be provided in a DAC by increasing the number of periods or cycles that a pulse width modulator (PWM) in the DAC utilizes to generate a train of output pulses that, together, have a desired duty cycle. In accordance with the invention, a relatively low resolution DAC may be controlled on a cycle by cycle basis by an iterative process to produce a train of pulse width modulated signals that, when low pass filtered, has a higher resolution than that of the base PWM in the DAC. This may be possible in systems and/or applications where changes or variations in analog signal values are significantly slower than the speed of operation in the digital circuitry. Since, in most instances, the AC energy in a PWM is at the PWM basic frequency, this approach may provide the benefit of utilizing a lower resolution PWM at a higher frequency of operation.

Figure 1:
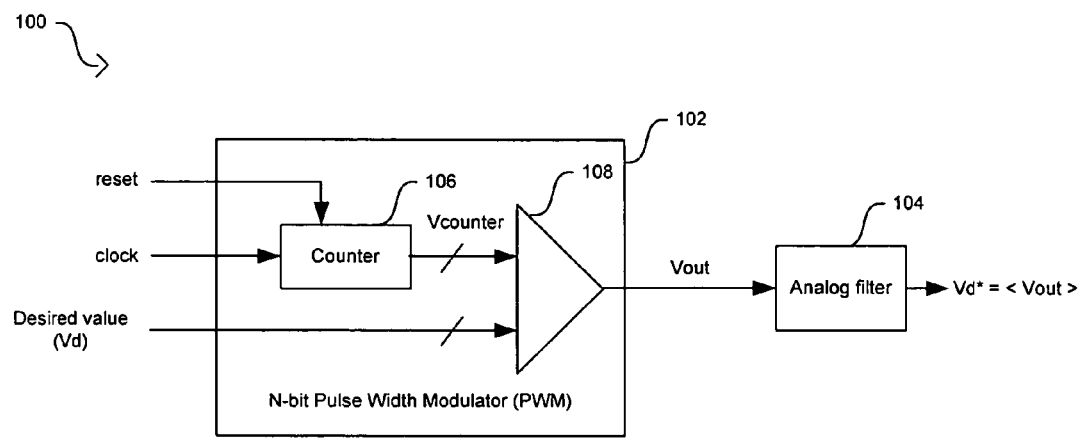
FIG. 1 is a block diagram of an exemplary system for digital-to-analog conversion utilizing a pulse width modulator, in connection with an embodiment of the invention.

FIG. 1 is a block diagram of an exemplary system for digital-to-analog conversion utilizing a pulse width modulator, in connection with an embodiment of the invention. Referring to FIG. 1, a DAC system 100 may comprise suitable logic, circuitry, and/or code that may be adapted to generate a desired analog value from a digital representation of the desired analog value. The DAC system 100 may comprise an N-bit PWM 102 and an analog filter 104. The N-bit PWM 102 may comprise a digital counter 106 and a digital comparator 108. The DAC system 100 may be adapted to generate a desired analog signal from a digital representation of the desired analog value, Vd. An accurate approximation of the desired analog signal, Vd*, may be generated by low pass filtering a pulse width modulated signal with a duty cycle that corresponds to the digital representation of the desired analog signal. The DAC system 100 may generate a similar pulse width modulated signal for each cycle or period where the digital representation of the desired analog value remains the same.

The digital counter 106 may comprise suitable logic, circuitry, and/or code that may be adapted to operate as an N-bit free running counter. The digital counter 106 may increment its output value, Vcounter, once each clock cycle and may count from 0 to $2^{N-1}$, for example. Once the digital counter 106 reaches its highest value, it may go back to zero at the next clock cycle. The digital counter 106 may repeat the counting process continuously or until a reset signal is provided to reset the counter value to zero at the next clock cycle regardless of the current counter value.

The digital comparator 108 may comprise suitable logic, circuitry, and/or code that may compare the digital values of Vd and Vcounter, where Vd and Vcounter may be N-bit digital words, for example. The digital comparator 108 may generate an output pulse, Vout, which may remain high until Vd and Vcounter are equal. In this regard, the duty cycle of the pulse with modulated signal from the digital comparator 108 may correspond to the digital representation of the desired analog value. The duty cycle may represent the percentage of time the pulse width modulated signal from the digital comparator 108 remains high relative to the entire period or cycle. For example, a signal that is high for 40% of the period and low for the remaining 60% of the period has a 40% duty cycle. For N-bit digital values, the number of pulse width sizes may be, for example, $2^N$, when a pulse width of zero is included, and the highest allowed value produces an output that is high for the entire period. A control word value of 0 may produce no pulse at all.

The analog filter 104 may comprise circuitry that may be adapted to low pass filter the pulse width modulated signal from the digital comparator 108 to generate An accurate approximation of the desired analog value, Vd*. In this regard, the analog filter 104 may convert the duty cycle of the pulse width modulated signal into a corresponding analog value. For example, a pulse width modulated signal with a 40% duty cycle may be converted into an analog signal with an amplitude of 40% the maximum available amplitude. In the case of a simple RC filter, for example, the amplitude of the output is determined by the amplitude of the input when it is high.

Figure 2:
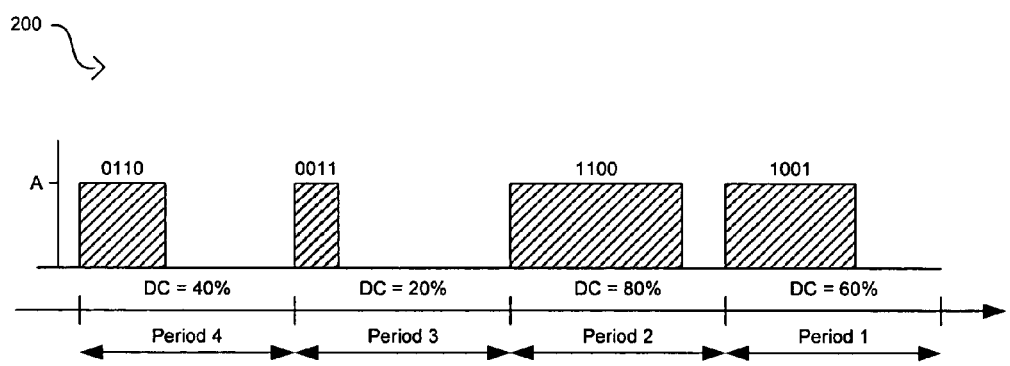
FIG. 2 illustrates exemplary modulated pulse width signals from a 4-bit pulse width modulator, in connection with an embodiment of the invention.

FIG. 2 illustrates exemplary modulated pulse width signals from a 4-bit pulse width modulator, in connection with an embodiment of the invention. Referring to FIG. 2, an exemplary train of pulse width modulated signals 200 generated by a 4-bit pulse width modulator (PWM) is shown. The 4-bit PWM in the DAC system 100 in FIG. 1 may be utilized, for example, and may generate 16 levels of resolution. The 4-bit PWM may produce no pulse at all when Vd is 0000, for example. For period 1 shown in FIG. 2, where period 1 may represent any period or cycle in the operation of the 4-bit PWM, a Vd of 1001 may generate a pulse width modulated signal with a duty cycle (DC) of 60%. Similarly, for periods 2, 3, and 4, Vds of 1100, 0011, and 0110 may generate pulse width modulated signals with duty cycles of 80%, 20%, and 40% respectively. Increasing the resolution of the N-bit PWM 102 by simply increasing the number N of resolution bits may prove to be an inefficient approach to increasing the resolution of the DAC system 100 in FIG. 1. Increasing the resolution of a PWM without increasing the clock frequency that it is counting decreases the cycle frequency. The AC energy at the cycle frequency needs to be removed by the analog filter.

As the output frequency decreases, the requirements of the analog filter 104 may increase and the ability of the DAC system 100 to change values quickly diminishes. For example, the use of an 8-bit PWM instead of a 4-bit PWM may increase the resolution of the DAC system 100 by a factor of 16 during a period or cycle, but the spectral requirements imposed on the analog filter 104 by the pulse width modulated signals from the 8-bit PWM may be difficult and/or costly to achieve in a predominantly digital IC.

Figure 3A:
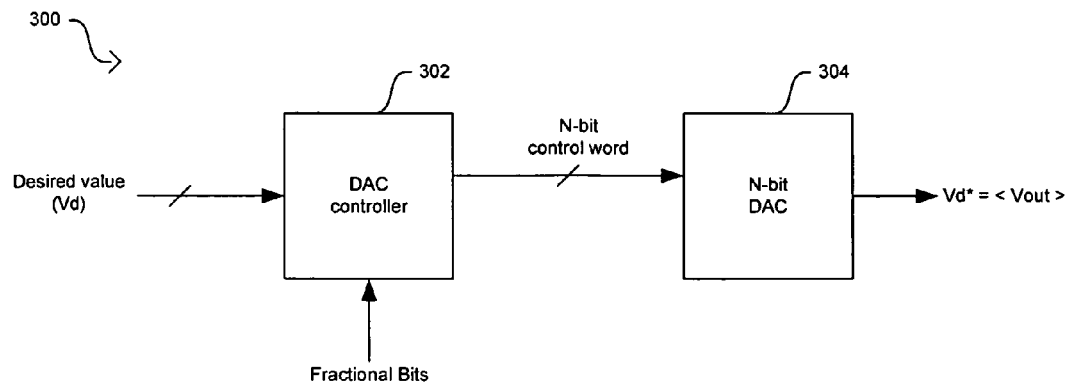
FIG. 3A is a block diagram of a digital-to-analog conversion system with increased effective resolution, in accordance with an embodiment of the invention.

FIG. 3A is a block diagram of a digital-to-analog conversion system with increased effective resolution, in accordance with an embodiment of the invention. Referring to FIG. 3A, the increased resolution DAC system 300 may comprise a DAC controller 302 and an N-bit DAC 304. The increased resolution DAC system 300 may be adapted to generate a desired analog signal from a digital representation of the desired analog value, Vd. An accurate approximation of the desired analog signal, Vd*, may be generated by low pass filtering a sequence of pulse width modulated signals generated from the digital representation of the desired analog signal.

The DAC controller 302 may comprise suitable logic, circuitry, and/or code that may be adapted to generate a sequence of control words based on a digital representation of a desired analog value, Vd, and a number FB of increased resolution bits or fractional bits. The N-bit DAC 304 may comprise suitable logic, circuitry, and/or code that may be adapted to generate a desired analog value from a sequence of control words generated by the DAC controller 302.

The DAC controller 302 may generate, for example, a sequence of N-bit control words by utilizing an iterative process that generates a control word for a period or cycle of operation of the N-bit DAC 304. The sequence of control words may be utilized to generate a sequence of pulse width modulated signals in the N-bit DAC 304 with the appropriate duty cycle to generate the desired analog value. In this regard, once the iterative process provides the desired analog value it may be continued as long as necessary or until a new desired analog value is needed. The desired value may be changed at any time. Although any desired analog value may result in a pattern that eventually repeats, the length of each repetition may not be the same for all desired analog values.

The pseudo C code that follows describes an exemplary iterative process initialization and processing rounds that may be utilized to generate the sequence of control words:

```
Accumulator = 0;
While( ) {
    Accumulator = Accumulator + Desired Value;
    Current Duty Cycle = Accumulator >> FB
    Accumulator = Accumulator − (Current Duty
    Cycle << Fractional Bits)
}
``` where Accumulator (ACC) is a holding variable, FB is the number of increased resolution bits or fractional bits, Desired Value (DV) is the digital representation of the desired analog value, the operators "<<" and ">>" correspond to bit shift down and bit shift up operations, and Current Duty Cycle (CDC) is a duty cycle for the pulse width modulated signal that may be generated from a control word corresponding to the current round in the iterative process. The Accumulator value may be initialized to 0 before a first round of processing in the iterative process. The iterative process described in the pseudo C code may be performed for a plurality of rounds of processing. The iterative process may be continued even when, for example, a new DV is needed. The iterative process, however, may be stopped when an interrupt signal is provided for that purpose.

Figure 3B:
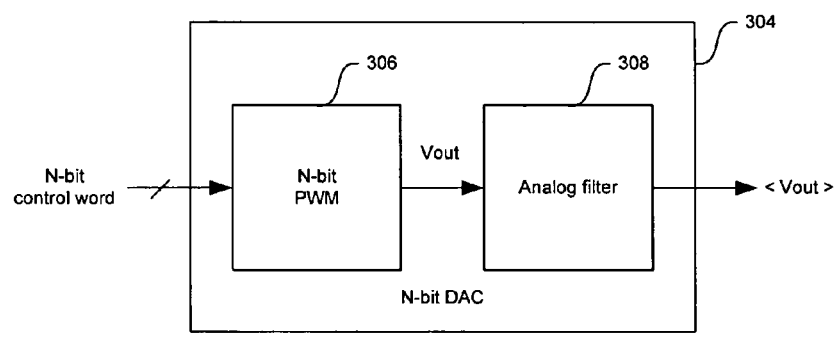
FIG. 3B is a block diagram of an N-bit DAC, in accordance with an embodiment of the invention.

FIG. 3B is a block diagram of an N-bit DAC, in accordance with an embodiment of the invention. Referring to FIG. 3B, the N-bit DAC 304 in FIG. 3A may comprise an N-bit PWM 306 and an analog filter 308. The N-bit PWM 306 may comprise suitable logic, circuitry, and/or code that may be adapted to generate a sequence of pulse width modulated signals that correspond to the sequence of N-bit control words generated by the DAC controller 302 in FIG. 3A. Each pulse width modulated signal may correspond to a period or cycle of the N-bit DAC 304. The analog filter 308 may comprise circuitry that may be adapted to convert the sequence of pulse width modulated signals generated by the N-bit PWM 306 into an accurate approximation of the desired analog value. The analog filter 308 may low pass filter an entire sequence or train of pulse width modulated signals that correspond to a digital representation of the desired analog value in order to generate the accurate approximation of the desired analog value. In some instances, the analog filter 308 may modify the desired analog value by applying a gain, for example. The gain may be utilized to increase or decrease the desired analog value. The approach described herein may also be used with a real DAC instead of a PWM. The advantage there is that a fast low-resolution DAC may be utilized as slower higher-resolution DAC.

Figure 4:
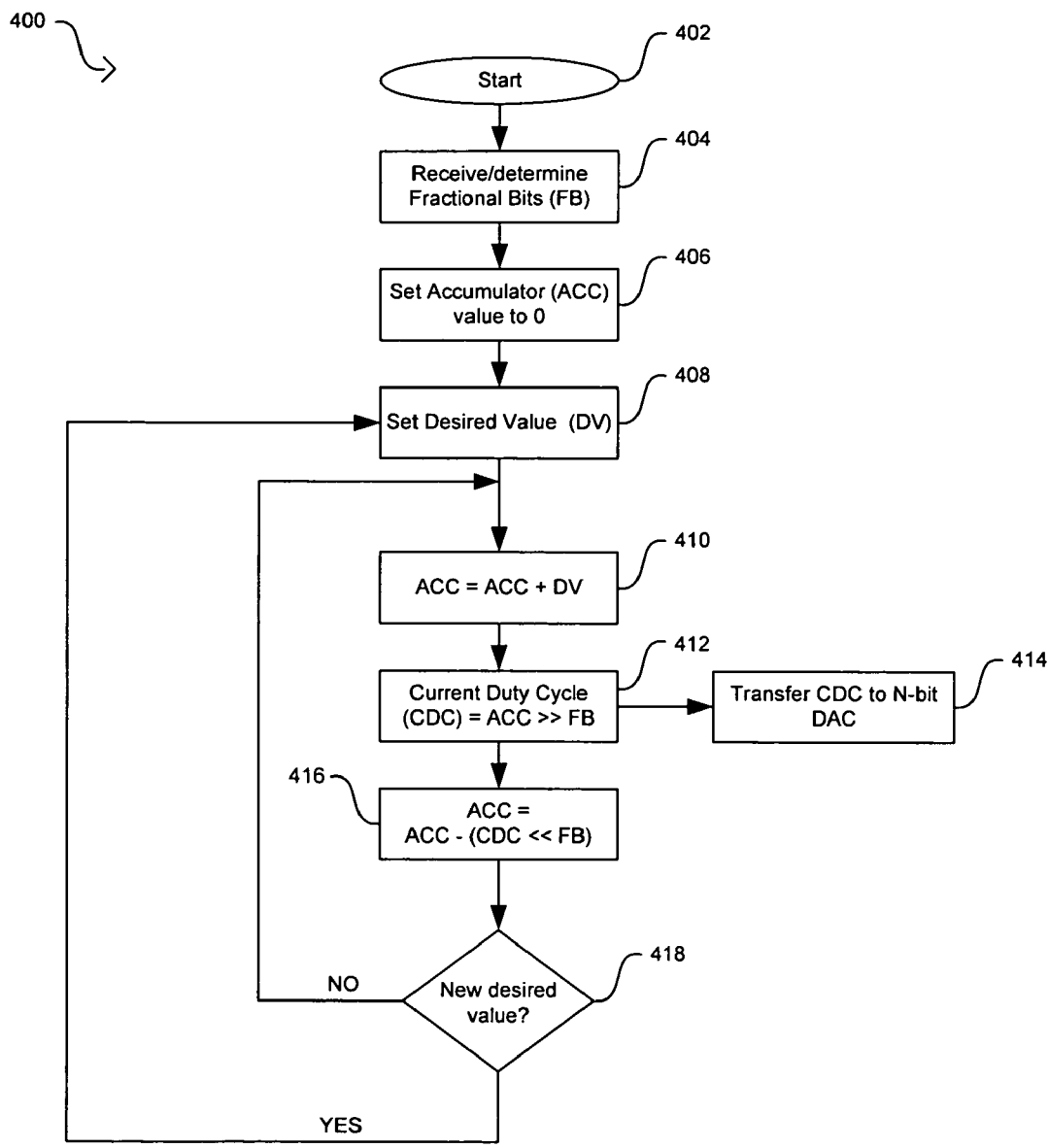
FIG. 4 is a flow diagram illustrating exemplary steps for increasing the effective resolution of the N-bit DAC, in accordance with an embodiment of the invention.

FIG. 4 is a flow diagram illustrating exemplary steps for increasing the effective resolution of the N-bit DAC, in accordance with an embodiment of the invention. Referring to FIG. 4, after start step 402, in step 404, the increased resolution DAC system 300 may receive and/or determine the fractional bits (FB) of increased resolution to be utilized. In step 406, the ACC value may be initialized to 0. In step 408, the increased resolution DAC system 300 may set the Desired Value to be utilized. In step 410, the ACC value may be updated based on the expression ACC=ACC+DV. In step 412, the CDC value may be determined based on the expression CDC=ACC >>FB. Once the CDC value is determined in step 412 it may be transferred in step 414 to the N-bit DAC 304 as a control value for a current cycle or period. In step 416, the ACC value may be update based on the expression ACC=ACC−(CDC<<FB). In step 418 the increased resolution DAC system 300 may determine whether a new DV has been received for processing. When a new DV has been received, the flow diagram 400 may proceed to step 406 and the iterative process may continue with the new DV. When a new DV has not been received, the flow diagram 400 may proceed to step 410 and the iterative process for the current DV may continue. An interrupt signal, for example, may be utilized to stop the iterative process.

Figure 5A:
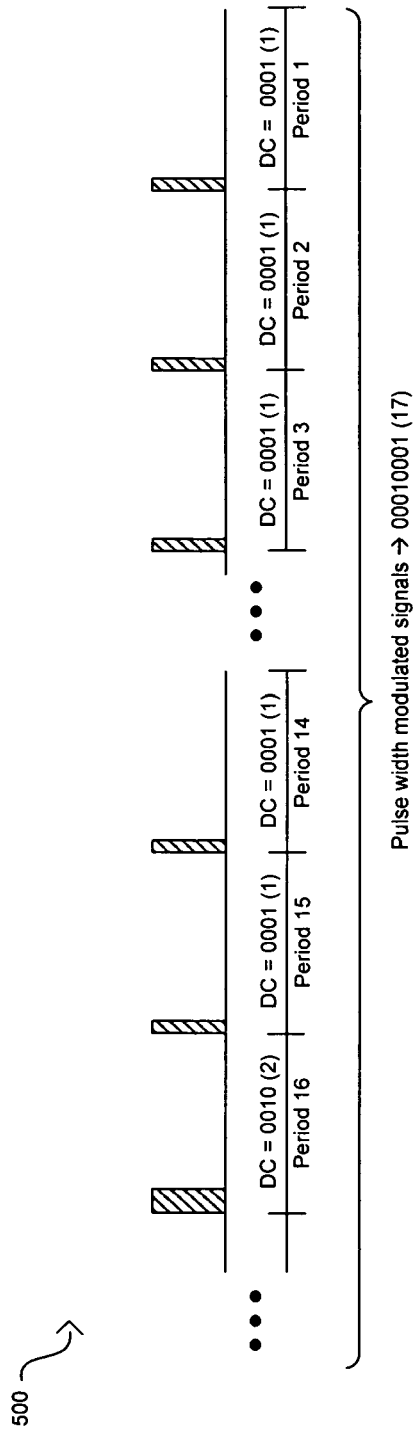
FIG. 5A illustrates an exemplary output of a 4-bit DAC that generates a desired value of 17 with an additional 4-bits of resolution, in accordance with an embodiment of the invention.

FIG. 5A illustrates an exemplary output of an increased resolution 4-bit DAC that generates a desired value of 17 with an additional 4-bits of resolution, in accordance with an embodiment of the invention. Referring to FIG. 5A, a train of pulse width modulated signals 500 may be utilized by an increased resolution 4-bit DAC to generate a desired analog value of, for example, a 17/255 resolution, or 00010001 in 8-bit representation. The increased resolution 4-bit DAC may be implemented, for example, utilizing the architecture of the increased resolution DAC system 300 in FIG. 3A. A conventional 4-bit DAC may only produce 16 analog levels, which in 8-bit number representation may be as follows: 00000000 (0), 00000001 (1), 00000010 (2), 00000011 (3), 00000100 (4), 00000101 (5), 00000110 (6), 00000111 (7), 00001000 (8), 00001001 (9), 00001010 (10), 00001011 (11), 00001100 (12), 00001101 (13), 00001110 (14), and 00001111 (15). Conventionally, the 4-bit DAC cannot reproduce an analog output value corresponding to 17/255 in 8-bit representation.

The train of pulse width modulated signals 500 that may be utilized to achieve the example average of 00010001 (17) may be produced by the increased resolution DAC system 300 using a technique based on the pseudo C code example described above. In particular, the Accumulator value may be initialized to a value of 0, the Desired Value is 00010001 (17), and FB is 4. In the initial iteration or first round of processing, the Accumulator value is increased by an amount equal to the Desired Value to achieve a new Accumulator value of 00010001 (17). A Current Duty Cycle value of 0001 (1) may be produced by taking the four most significant bits of the Accumulator value. The Accumulator value is then decreased by an amount that is produced by appending four least significant bits to the Current Duty Cycle value, for example, by an amount equal to 0001000 (16), which leaves the Accumulator value with a value of 00000001 (1). The Current Duty Cycle determined during the first round of processing corresponds to the duty cycle (DC) of the pulse width modulated signal in period 1 of the train of pulse width modulated signals 500 in FIG. 5A. The pulse width modulated signal in period 1 has a duty cycle of 0001 or 6.67%, which may correspond to a pulse width of one clock cycle in a period with a duration of 15 clock cycles, for example.

In the next iteration or second round of processing, the Accumulator value is increased by an amount equal to the Desired Value to achieve a new Accumulator value of 00010010 (18). The Current Duty Cycle of 0001 (1) may be produced by taking the four most significant bits of the Accumulator value. The Accumulator value may be decreased by an amount that is produced by appending four least significant 0 bits to the Current Duty Cycle value, for example, by an amount equal to 00010000 (16), which leaves the Accumulator value with a value of 00000010 (2). As with the signal in period 1, the pulse width modulated signal in period 2 also has a duty cycle of 0001 or 6.67%. In the next round or iteration of the iterative procedure, Current Duty Cycle is 0001 (1) and the final Accumulator value is 0011 (3). The pulse width modulated signal in period 3 also has a duty cycle of 0001 or 6.67%.

The Current Duty Cycle value in each round of processing may represent the current output level of a period in the increased resolution 4-bit DAC. Thus, for rounds 1–15 in the current example of achieving the average analog output value of 00010001 (17), the output level of an increased resolution 4-bit DAC is represented by 0001 (1) which corresponds in 8-bit terminology to 00010000 (16).

During round 16 in the current example of achieving the average analog output value of 00010001 (17), the Accumulator value starts with a value of 00001111 (15), and the Accumulator value may be increased by 00010001 (17) to a new Accumulator value of 00100000 (32). A Current Duty Cycle value of 0010 (2) may be produced by taking the four most significant bits of the Accumulator value. The Accumulator value may be decreased by an amount equal to 00100000 (32), which leaves the Accumulator value with a value of 00000000 (0). Thus in round or iteration 16, the output level or duty cycle of the increased resolution 4-bit DAC is represented by 0010 (2) which corresponds in 8-bit terminology to 00100000 (32). In this regard, the pulse width modulated signal in period 16 of the train of pulse width modulated signals 500 has a duty cycle of 0010 (2) or 13.33%%, which may correspond to a pulse width of two clock cycles in a period with a duration of 15 clock cycles, for example.

In this illustrative example a sequence of 16 periods is produced corresponding to 15 instances of an output level represented by 0001 (1) which corresponds in 8-bit terminology to 00010000 (16) followed by one instance of an output level represented by 0010 (2) which corresponds in 8-bit terminology to 00100000 (32). The average over time of the 15 instances of 00010000 (16) followed by one instance of 00100000 (32) is the desired average 00010001 (17). The iterative process may continue past the first 16 periods of processing illustrated in this example and the desired average analog output will be maintained.

Figure 5B:
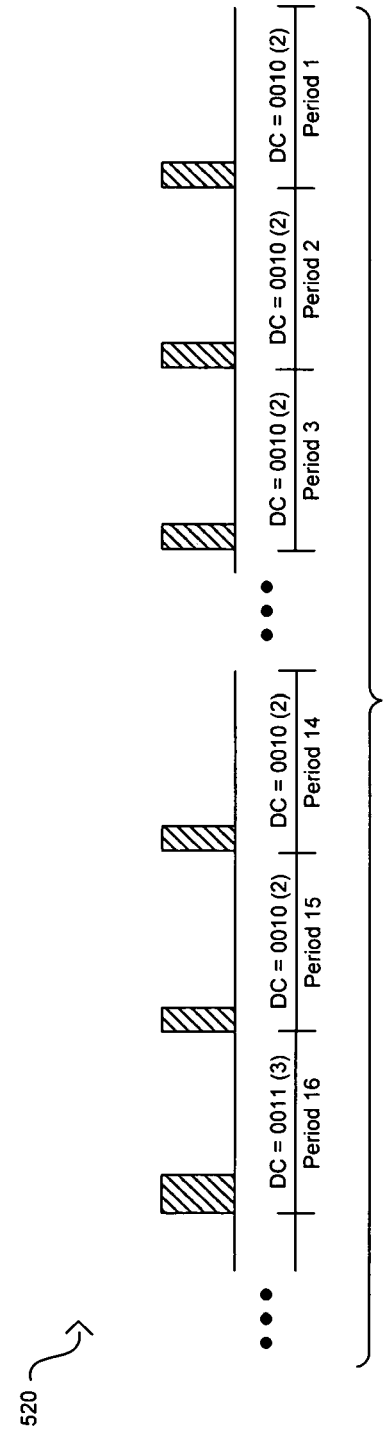
FIG. 5B illustrates an exemplary output of a 4-bit DAC that generates a desired value of 33 with an additional 4-bits of resolution, in accordance with an embodiment of the invention.

FIG. 5B illustrates an additional exemplary output of an increased resolution 4-bit DAC that generates a desired value of 33 with an additional 4-bits of resolution, in accordance with an embodiment of the invention. Referring to FIG. 5B, the train of pulse width modulated signals 520 may be utilized by an increased resolution 4-bit DAC to generate a desired analog value of 33, or 00100001 in 8-bit representation. As with the example described in FIG. 5A, the iterative process based on the pseudo C code described above may be utilized to generate the desired analog value output. In this example, rounds 1–15 may generate a Current Duty Cycle value of 0010 (2) that may be utilized to generate pulse width modulated signals with duty cycles (DC) of 13.33% in periods 1–15. In round 16 of the illustrative example in FIG. 5B, the Current Duty Cycle value is 0011 (3) and a pulse width modulated signal with a duty cycle of 20% is generated during period 16 of the train of pulse width modulated signals 520. The average over time of the 15 instances of 00100000 (32) followed by one instance of 00110000 (48) is the desired average 00100001 (33). As with the previous example, the iterative process may continue past the first 16 periods of processing and the desired average analog output will be maintained.

An additional advantage of the increased resolution approach described herein is illustrated by the following example comparing a conventional 16-bit PWM to an increased resolution DAC implemented in accordance with the invention. The example relies on the following specifications: PWM clock is 54 MHz and resolution of 16 bits.

The conventional 16-bit PWM may not generate a pulse for a control word with an input value of 0. For a control word with an input of 1, the conventional 16-bit PWM outputs a high value for one cycle of the 54 MHz clock and a 0 for the remaining 65534 clock cycles of the pulse period, for example. For a control word with an input of 2, for example, the conventional PWM may output a high value for the first two cycles and a low for the remaining 65533 clock cycles of the pulse period. Thus the basic operating frequency of the conventional 16-bit PWM is 824 Hz (54 Mhz/65,536). The pulse train that results from a control word with a value of 1 has a frequency component at the basic operating frequency but it is quite small because the duty cycle of the pulse is quite small. As the input value to the 16-bit PWM gets closer to 65,535/2, the amplitude of the basic operating frequency component of the output also increases to the point where it is quite significant and requires significant filtering to remove.

An exemplary implementation of the invention may comprise an increased resolution DAC implemented by a 9-bit PWM whose output is filtered by an analog filter. The 9-bit PWM in the increased resolution DAC may have 512 different duty cycles and thus may have a basic operating frequency of 105,675.15 Hz (54 MHZ/511). Just as with the conventional 16-bit PWM, a control word with an input value of 1 to the increased resolution DAC results in an output of one clock cycle being high every 65,536 clock cycles, for example. However, as a result of the iterative process described herein, a control word with an input value of 2 may result in a one clock wide pulse at twice the frequency while a control word with an input value of 3 may result in a one clock wide pulse at 3 times the frequency. A control word with an input value of 65,536/2 may produce a square wave at the 105 KHz base frequency. Thus in accordance with the invention, most of the AC energy of the output is concentrated at the basic modulator's output frequency and above. The increased resolution DAC also has the desirable property over most of the of the output range of not generating minimum length pulses. This is desirable because, in at least some cases, due to the analog nature of output pads on integrated circuits, the average value of a two clock wide pulse train is not exactly twice the average value of a one clock wide pulse train. However, the increase in average with each additional clock after the first is nearly constant.

The approach described herein may provide additional effective resolution in an DAC by increasing the number of periods or cycles that a PWM in the DAC utilizes to generate an output pulse width with a desired duty cycle. In addition to higher resolution, this approach may also concentrate most of the output pulse AC energy at the PWM basic frequency and above, allowing for simpler analog filtering of the train of pulse width modulated signals utilized to generate the desired analog output.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for digital-to-analog signal conversion, the method comprising:
generating a plurality of control words based on a number of increased resolution bits and a digital representation of a desired analog value;
generating a plurality of pulse width modulated signals, wherein a duty cycle of each of said plurality of pulse width modulated signals corresponds to one of said generated plurality of control words; and
generating said desired analog value based on said generated plurality of pulse width modulated signals.

2. The method according to claim 1, further comprising generating said plurality of control words by an iterative process, wherein a round of processing in said iterative process comprises:
generating a current accumulator value by adding said digital representation of said desired analog value to a previous accumulator value;

generating a duty cycle by shifting down said generated current accumulator value by said number of increased resolution bits;

shifting up said generated duty cycle by said number of increased resolution bits; and generating a next accumulator value by adding said shifted up generated duty cycle to said generated current accumulator value.

3. The method according to claim 2, further comprising assigning said generated duty cycle to one of said plurality of control words that corresponds to a current round of processing.

4. The method according to claim 2, further comprising assigning a zero value to said previous accumulator value before a first round of processing in said iterative process.

5. The method according to claim 2, further comprising performing said iterative process until a new desired analog value is provided.

6. The method according to claim 2, further comprising performing said iterative process until an interrupt signal is provided.

7. A machine-readable storage having stored thereon, a computer program having at least one code for digital-to-analog signal conversion, the at least one code section being executable by a machine for causing the machine to perform steps comprising:

generating a plurality of control words based on a number of increased resolution bits and a digital representation of a desired analog value;

generating a plurality of pulse width modulated signals, wherein a duty cycle of each of said plurality of pulse width modulated signals corresponds to one of said generated plurality of control words; and generating said desired analog value based on said generated plurality of pulse width modulated signals.

8. The machine-readable storage according to claim 7, further comprising code for generating said plurality of controls words by an iterative process, wherein a round of processing in said iterative process comprises:

generating a current accumulator value by adding said digital representation of said desired analog value to a previous accumulator value;

generating a duty cycle by shifting down said generated current accumulator value by said number of increased resolution bits;

shifting up said generated duty cycle by said number of increased resolution bits; and generating a next accumulator value by adding said shifted up generated duty cycle to said generated current accumulator value.

9. The machine-readable storage according to claim 8, further comprising code for assigning said generated duty cycle to one of said plurality of control words that corresponds to a current round of processing.

10. The machine-readable storage according to claim 8, further comprising code for assigning a zero value to said previous accumulator value before a first round of processing in said iterative process.

11. The machine-readable storage according to claim 8, further comprising code for performing said iterative process until a new desired analog value is provided.

12. The machine-readable storage according to claim 8, further comprising code for performing said iterative process until an interrupt signal is provided.

13. A system for digital-to-analog signal conversion, the system comprising:

a DAC controller that generates a plurality of control words based on a number of increased resolution bits and a digital representation of a desired analog value;

an N-bit DAC that generates a plurality of pulse width modulated signals, wherein a duty cycle of each of said plurality of pulse width modulated signals corresponds to one of said generated plurality of control words; and said N-bit DAC generates said desired analog value based on said generated plurality of pulse width modulated signals.

14. The system according to claim 13, wherein said DAC controller generates said plurality of controls words by an iterative process and a round of processing in said iterative process comprises:

generating a current accumulator value by adding said digital representation of said desired analog value to a previous accumulator value;

generating a duty cycle by shifting down said generated current accumulator value by said number of increased resolution bits;

shifting up said generated duty cycle by said number of increased resolution bits; and generating a next accumulator value by adding said shifted up generated duty cycle to said generated current accumulator value.

15. The system according to claim 14, wherein said DAC controller assigns said generated duty cycle to one of said plurality of control words that corresponds to a current round of processing.

16. The system according to claim 14, wherein said DAC controller assigns a zero value to said previous accumulator value before a first round of processing in said iterative process.

17. The system according to claim 14, wherein said DAC controller performs said iterative process until a new desired analog value is provided.

18. The system according to claim 14, wherein said DAC controller performs said iterative process until an interrupt signal is provided.

19. The system according to claim 13, wherein said N-bit DAC is based on a pulse width modulator (PWM).

20. The system according to claim 13, wherein said N-bit DAC is a conventional DAC.

* * * * *